(12) United States Patent
Komoto

(10) Patent No.: US 8,667,669 B2
(45) Date of Patent: Mar. 11, 2014

(54) APPARATUS AND METHOD FOR MANUFACTURING A PACKAGED DEVICE

(75) Inventor: Yoshio Komoto, Gunma (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 13/208,352

(22) Filed: Aug. 12, 2011

(65) Prior Publication Data

US 2012/0205143 A1 Aug. 16, 2012

Related U.S. Application Data

(63) Continuation of application No. PCT/JP2010/000186, filed on Jan. 15, 2010.

(30) Foreign Application Priority Data

Mar. 27, 2009 (JP) .................................. 2009-080568

(51) Int. Cl.
*B23P 19/00* (2006.01)
(52) U.S. Cl.
USPC ................... 29/740; 29/709; 29/832; 29/843; 228/102
(58) Field of Classification Search
USPC ........... 29/709, 712, 740, 832–834, 840, 843; 228/8, 9, 102
See application file for complete search history.

(56) References Cited

U.S. PATENT DOCUMENTS 4,835,847 A * 6/1989 Kamperman ................... 29/840
5,607,097 A * 3/1997 Sato et al. .......................... 228/8
6,904,672 B2 * 6/2005 Nagafuku et al. .............. 29/834

FOREIGN PATENT DOCUMENTS

| CN | 1711478 A | 12/2005 |
| CN | 101114630 A | 1/2008 |
| CN | 101164151 A | 4/2008 |
| JP | H05-343473 A | 12/1993 |
| JP | H10-307293 A | 11/1998 |
| JP | 3163751 B2 | 5/2001 |
| JP | 2005-50911 A | 2/2005 |
| JP | 2006-173503 A | 6/2006 |
| JP | 2008-147367 A | 6/2008 |
| JP | 4122102 B2 | 7/2008 |
| WO | 2007/096946 A1 | 8/2007 |

OTHER PUBLICATIONS

International Search Report for International Application No. PCT/JP2010/000186, mailed on Apr. 13, 2010.
English translation of Written Opinion (IB338) for International application No. PCT/JP2010/000186, mailed on Oct. 27, 2011.
Office action issued by the Korean Intellectual Property Office on Oct. 26, 2012.
Office action issued by the Taiwan Patent Office on Nov. 20, 2012 for Ref. No. (101)IP-2(1)-04174-10121281800.
"Notification of First Office Action" issued by the State Intellectual Property Office of the P.R. China for filing No. 2010800134078, Date: May 6, 2013.

\* cited by examiner

*Primary Examiner* — Donghai D Nguyen

(57) ABSTRACT

It is an objective of the present invention to eliminate wafer testing. Provided is a manufacturing apparatus comprising a detecting section that detects a position of a device terminal of a device; a generating section that generates a substrate-side terminal, which connects to the device terminal, on a substrate at a position corresponding to the device terminal; and a mounting section that mounts the device on the substrate and connects the device terminal to the substrate-side terminal. The detecting section captures an image of the device and detects the position of the device terminal based on the captured image, and the generating section prints a pattern of the substrate-side terminal on the substrate at a position corresponding to the device terminal.

20 Claims, 15 Drawing Sheets

APPARATUS AND METHOD FOR MANUFACTURING A PACKAGED DEVICE

BACKGROUND

1. Technical Field

The present invention relates to a manufacturing apparatus and a manufacturing method for manufacturing a device, and to a packaged device.

2. Related Art

A known apparatus for testing a plurality of devices formed on a semiconductor wafer uses a probe card that can contact a large number of electrodes of the wafer en bloc (see Patent Document 1). This apparatus is placed in an analyzing device while the probe card is in contact with the wafer under test, and analysis is performed at a high temperature, for example. Patent Document 2 describes an apparatus that houses chips in a package that is the same as the commercial package, and tests the chips in this state.

Patent Document 1: Japanese Patent Application Publication No. 2006-173503

Patent Document 2: Japanese Patent No. 4122102

However, in each of the above apparatuses, a large number of wires must be connected to manufacture the probe card, and this incurs a high cost. Furthermore, it is difficult to adjust the relative positions of the wafer under test and the probe card. When testing chips after dicing that are housed in a package that is the same as the commercial package, the package configuration is complicated and the cost of the package is high.

SUMMARY

Therefore, it is an object of an aspect of the innovations herein to provide a manufacturing apparatus, a manufacturing method, and a packaged device, which are capable of overcoming the above drawbacks accompanying the related art. The above and other objects can be achieved by combinations described in the independent claims. The dependent claims define further advantageous and exemplary combinations of the innovations herein.

In order to solve the above problems, according to a first aspect related to the innovations herein, provided is a manufacturing apparatus comprising a detecting section that detects a position of a device terminal of a device; a generating section that generates a substrate-side terminal, which connects to the device terminal, on a substrate at a position corresponding to the device terminal; and a mounting section that mounts the device on the substrate and connects the device terminal to the substrate-side terminal. Also provided is a manufacturing method.

According to a second aspect related to the innovations herein, provided is a packaged device comprising a device that includes an electronic circuit; a first substrate on which the device is mounted: and a flexible second substrate that sandwiches the device together with the first substrate, by being placed on a surface of the first substrate on which the device is mounted.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
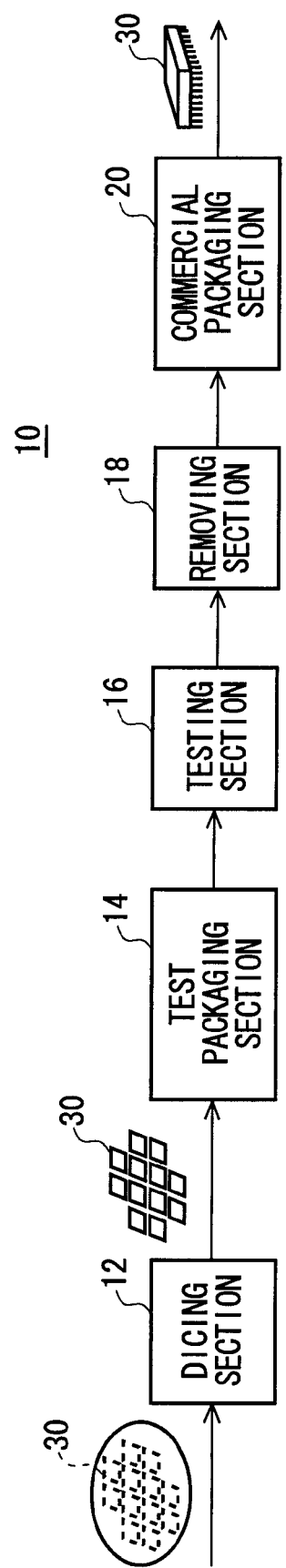
FIG. 1 shows a configuration of a device manufacturing system 10 according to an embodiment of the present invention.

FIG. 1 shows a configuration of a device manufacturing system 10 according to an embodiment of the present invention. The device manufacturing system 10 manufactures a packaged device from a circular wafer on which a plurality of devices 30 are formed. The device manufacturing system 10 includes a dicing section 12, a test packaging section 14, a testing section 16, a removing section 18, and a commercial packaging section 20.

The dicing section 12 dices the wafer on which devices 30 having electronic circuits are formed, to separate the devices 30 as chips. The test packaging section 14 packages the devices 30 resulting from the dicing by the dicing section 12 in test packages.

The testing section 16 tests the devices 30 packaged in the test packages, as a device under test. The testing section 16 may be a test apparatus that tests a semiconductor circuit, for example.

The removing section 18 removes the devices 30 that have been tested from the test packages. The commercial packaging section 20 packages the devices 30 removed from the test packages in commercial packages.

Figure 2:
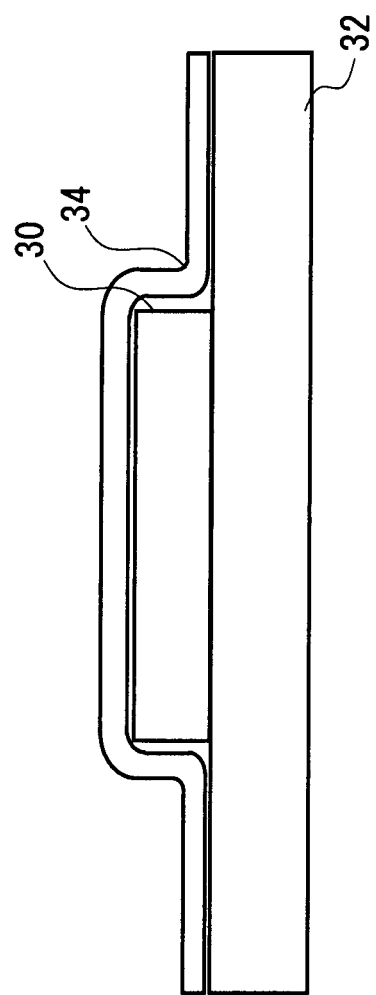
FIG. 2 shows an exemplary packaged device that is packaged in a test package manufactured by the device manufacturing system 10 according to the present embodiment.

FIG. 2 shows an exemplary packaged device 28 for testing. The packaged device 28 for testing includes a device 30 in chip form, a first substrate 32, and a second substrate 34.

The device 30 in chip form is loaded on the first substrate 32. The second substrate 34 is a flexible substrate. The second substrate 34 is layered on the surface of the first substrate 32 on which the device 30 is mounted, and sandwiches the device 30 together with the first substrate 32.

The packaged device 28 includes the device 30 held between two substrates, and therefore the packaged device 28 is easier to handle than just a chip. For example, the packaged device 28 can be handled by a test apparatus for testing a device that is commercially packaged.

Figure 3:
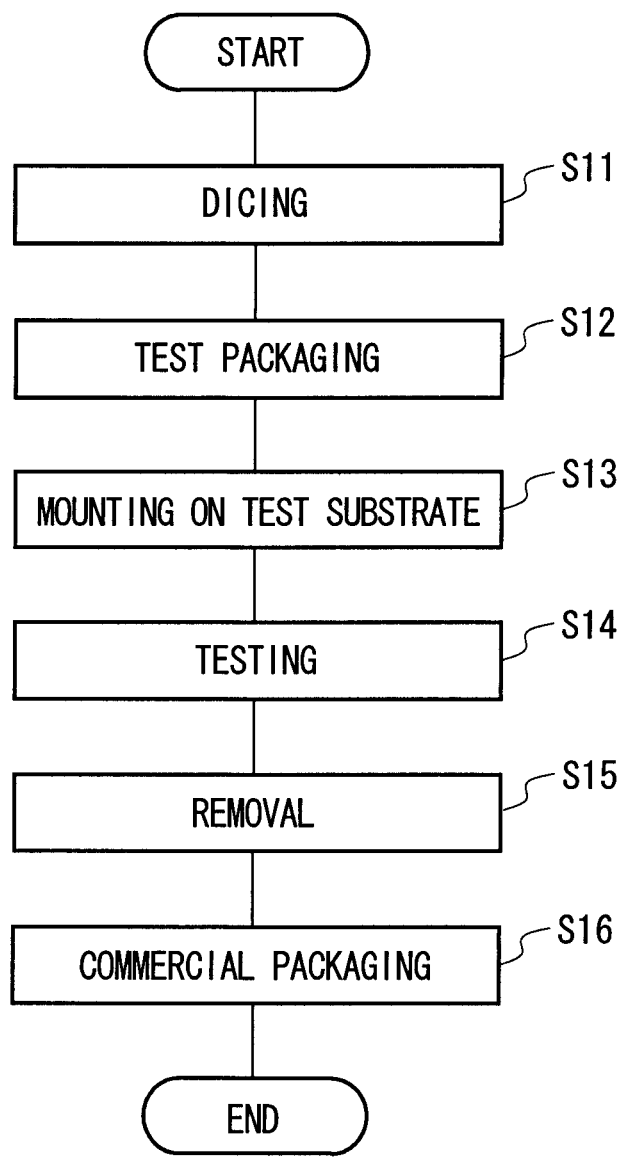
FIG. 3 shows a process flow of the device manufacturing system 10 according to the present embodiment.

FIG. 3 shows a process flow of the device manufacturing system 10 according to the present embodiment. First, at step S11, the dicing section 12 separates the devices 30 into chip form by dicing the wafer on which the devices 30 are formed.

Next, at step S12, the test packaging section 14 individually packages each of the devices 30 in chip form cut at step S11 into a test package created for each device 30. The test packaging section 14 may seal each device 30 inside a test package, for example.

As an example, as shown in FIG. 2, the test packaging section 14 may seal each device 30 between the first substrate 32 and the second substrate 34 by suctioning out the gas between the first substrate 32 and the second substrate 34, at least one of which is a flexible substrate. In the present embodiment, the test packaging section 14 affixes the second substrate 34, which is a flexible substrate, to the first substrate 32 and the device 30 using vacuum suction or decompression suction.

As another example, the test packaging section 14 may sandwich the device 30 between the first substrate 32 and the second substrate 34 by using a tensile force to press the second substrate 34, which is a flexible substrate, against the first substrate 32. A detailed description of the packaging method of step S12 is provided further below in FIG. 4 and onward.

Next, at step S13, the test packaging section 14 mounts the device 30, which is packaged in the test package, onto a test substrate for connecting the device 30 to an external apparatus. If the external apparatus can directly exchange signals with the device 30 packaged in the test package, there is no need to mount the device 30 on the test substrate.

Next, at step S14, the testing section 16 exchanges signals with the device 30 via the test substrate to test the device 30 packaged in the test package. In this case, the testing section 16 may test a plurality of devices 30 in parallel. In this way, the testing section 16 can improve the throughput of the testing.

Next, at step S15, the removing section 18 removes the device 30 for which testing has been completed from the test package. If the device 30 is sealed between the first substrate 32 and the second substrate 34, the removing section 18 may remove the device 30 from the test package by injecting gas between the first substrate 32 and the second substrate 34.

The removing section 18 may remove, from the test package, each device 30 that is judged to be an acceptable product based on the results of the testing of step S14. Furthermore, the removing section 18 may dispose of the test package from which the device 30 was removed.

Next, at step S16, the commercial packaging section 20 packages the device 30 removed from the test package in a commercial package. The commercial packaging section 20 may package each device 30 that is judged to be an acceptable product based on the results of the testing in a commercial package.

The commercial packaging section 20 may package two or more device 30 that were tested individually in a single commercial package. In this case, the commercial packaging section 20 may three-dimensionally implement two or more devices 30 cut from one or more wafers. The commercial packaging section 20 may package two or more such devices 30 in a commercial package by implementing the devices 30 in a multi-chip module.

The device manufacturing system 10 of the present embodiment packages the devices 30 cut from a wafer in test packages, and tests the test packages. Accordingly, the device manufacturing system 10 can perform, on the devices in chip form, a test that was performed on the devices 30 prior to being cut from the wafer. As a result, the device manufacturing system 10 can eliminate wafer testing and decrease the testing cost.

Figure 4:
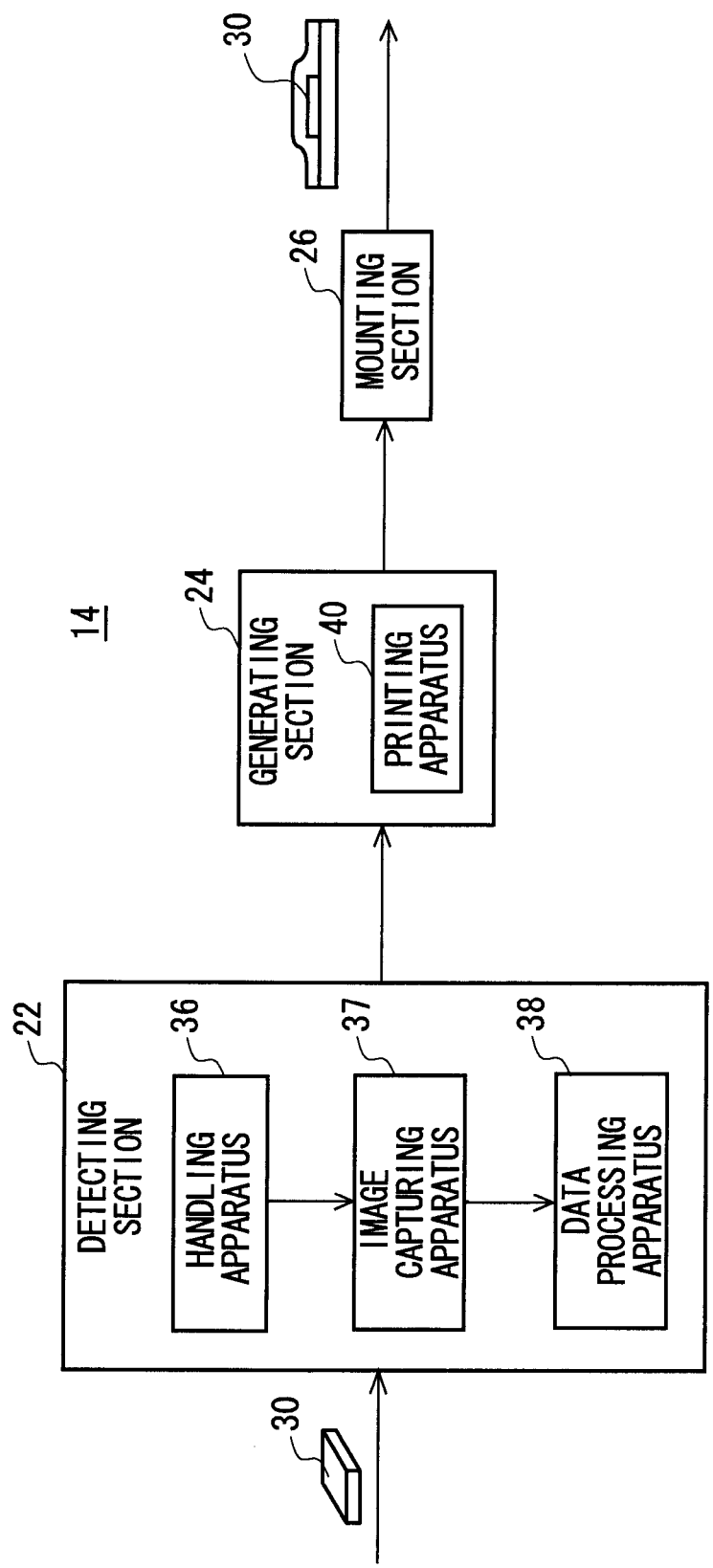
FIG. 4 shows a functional configuration of the test packaging section 14.

FIG. 4 shows a functional configuration of the test packaging section 14. The test packaging section 14 includes a detecting section 22, a generating section 24, and a mounting section 26.

The detecting section 22 detects the position of a device terminal of the device 30 in chip form. The detecting section 22 may include a handling apparatus 36, an image capturing apparatus 37, and a data processing apparatus 38, for example.

The handling apparatus 36 adheres the device 30 thereto to handle the device 30. The image capturing apparatus 37 captures an image of the surface of the device 30 handled by the handling apparatus 36. The data processing apparatus 38 detects the position of the device terminal formed on the surface of the device 30, based on the image captured by the image capturing apparatus 37.

The generating section 24 generates a substrate-side terminal, which connects to the device terminal, on a substrate forming the test package at a position corresponding to the device terminal detected by the detecting section 22. The generating section 24 may also generate an external terminal on a substrate forming the test package, for connecting the substrate to an external apparatus. The generating section 24 generates a wire that connects the external terminal to the substrate-side terminal.

The generating section 24 may include a printing apparatus 40. The printing apparatus 40 prints a designated pattern on the substrate by applying a semiconductor material on the substrate. In this way, the printing apparatus 40 can generate the substrate-side terminal, the external terminal, and the wire on the substrate. The mounting section 26 mounts the device 30 in chip form on the substrate and connects the device terminal to the substrate-side terminal.

Figure 5:
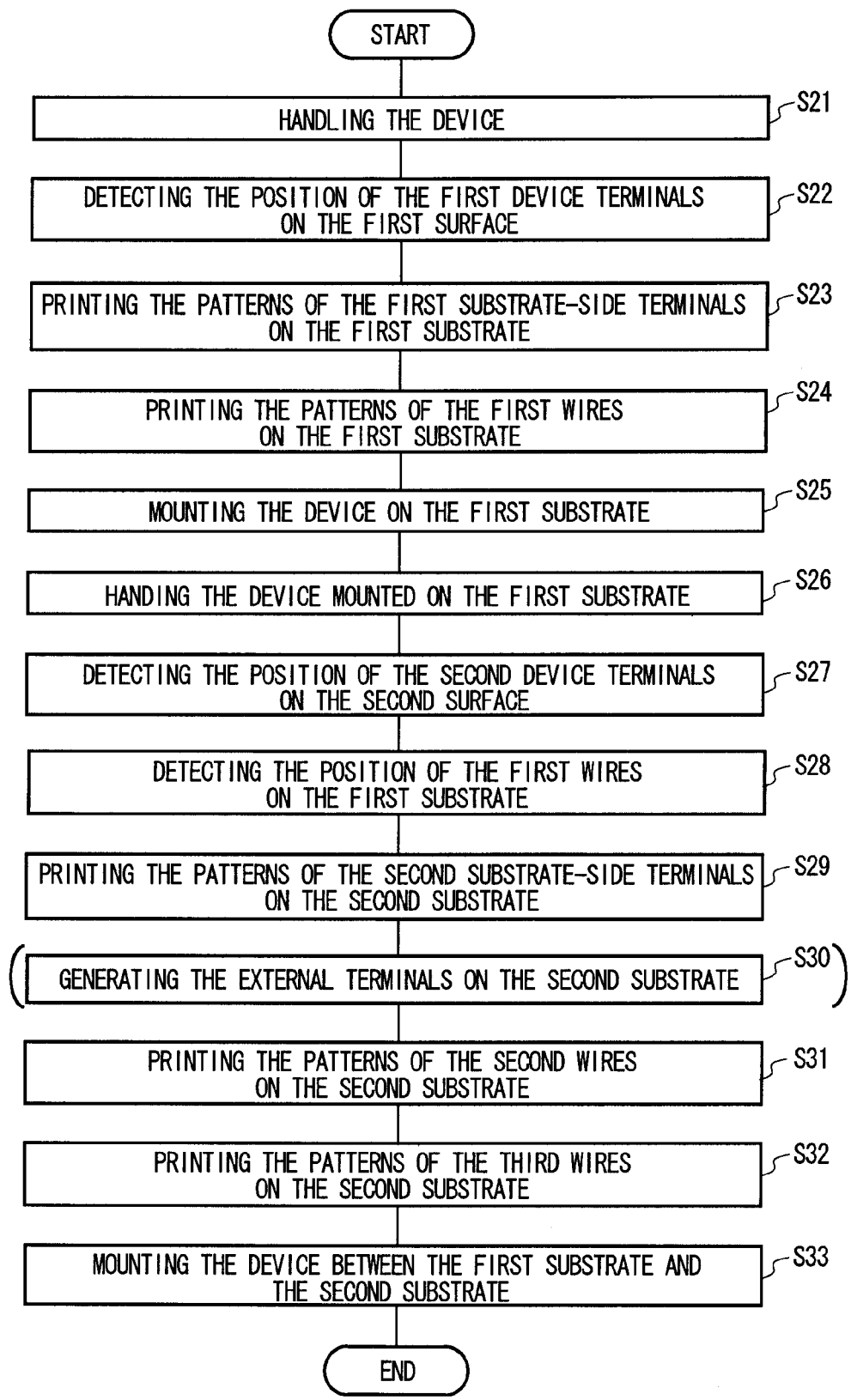
FIG. 5 shows a process flow of the test packaging section 14 according to the present embodiment.
Figure 6:
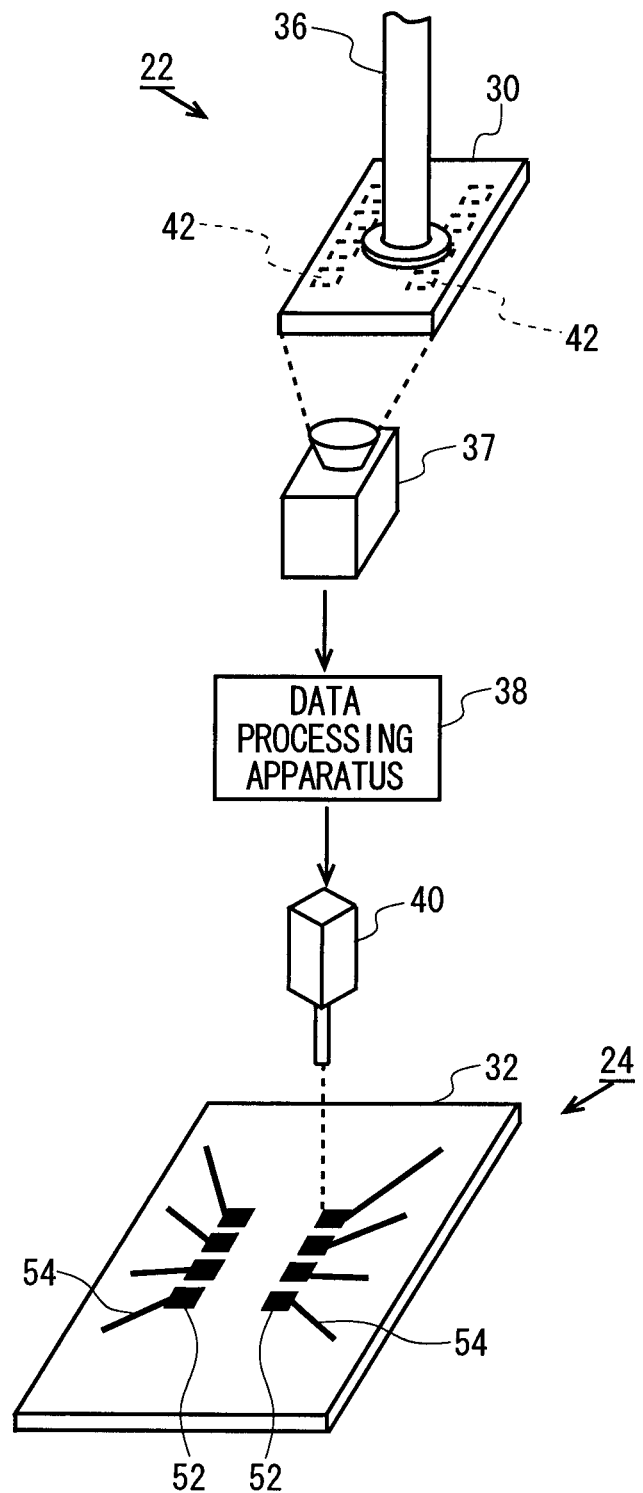
FIG. 6 shows an exemplary operation of the test packaging section 14 performed from step S21 to step S24 of FIG. 5.
Figure 7:
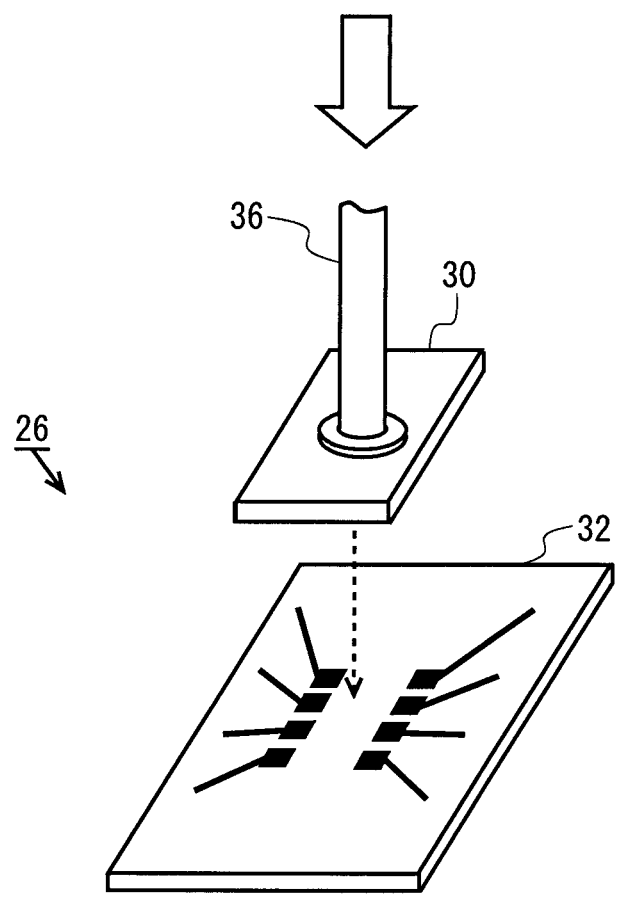
FIG. 7 shows an exemplary operation of the test packaging section 14 performed at step S25 of FIG. 5.
Figure 8:
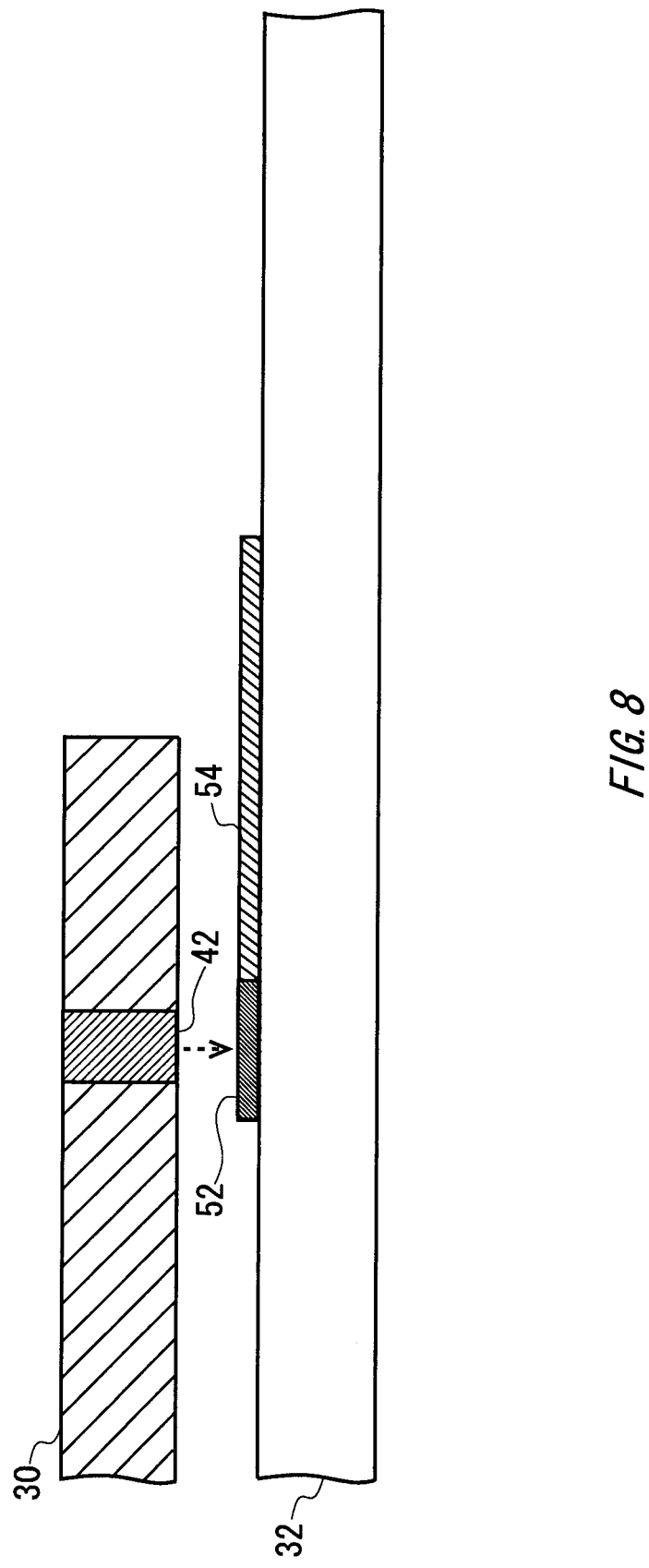
FIG. 8 shows an exemplary connection between the first device terminals 42 of the device 30 and the first substrate-side terminals 52 of the first substrate 32.
Figure 9:
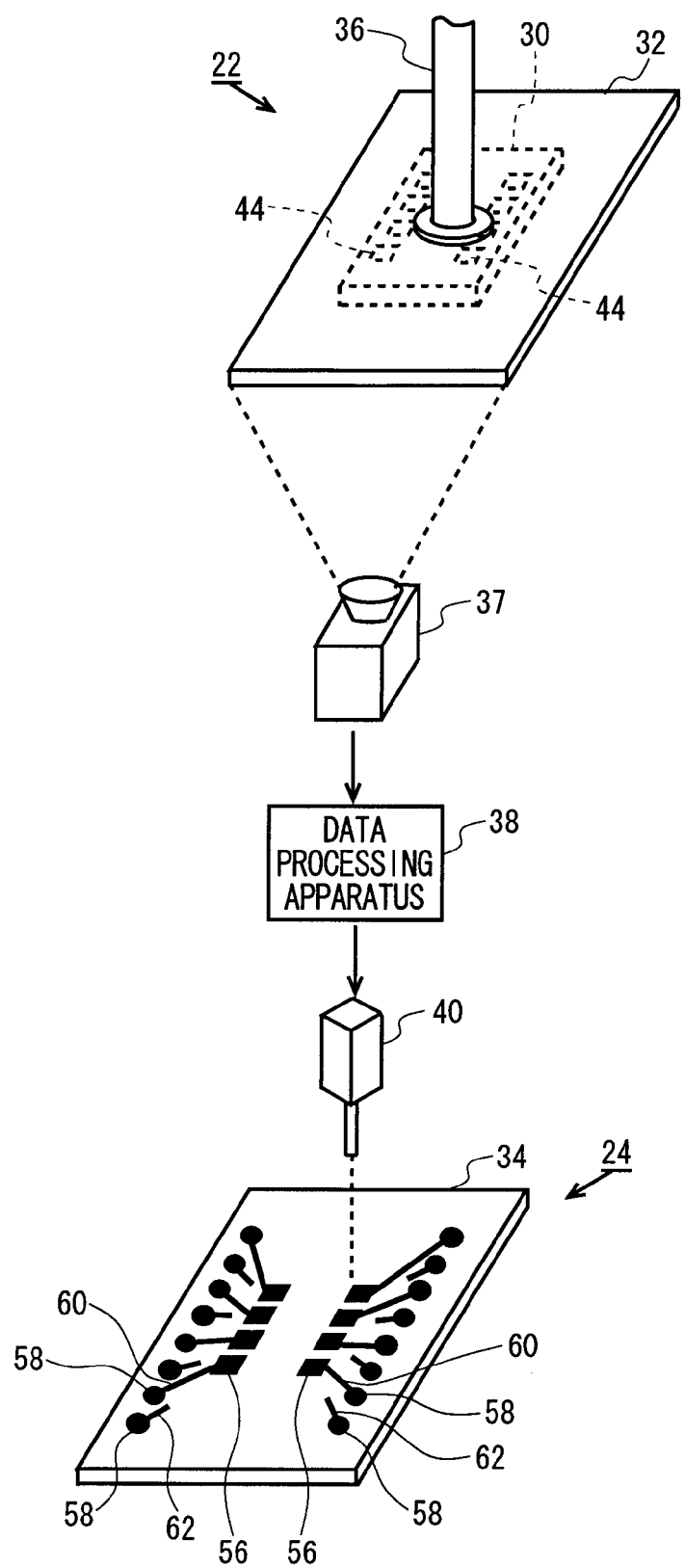
FIG. 9 shows an exemplary operation of the test packaging section 14 performed from step S26 to step S32 of FIG. 5.
Figure 10:
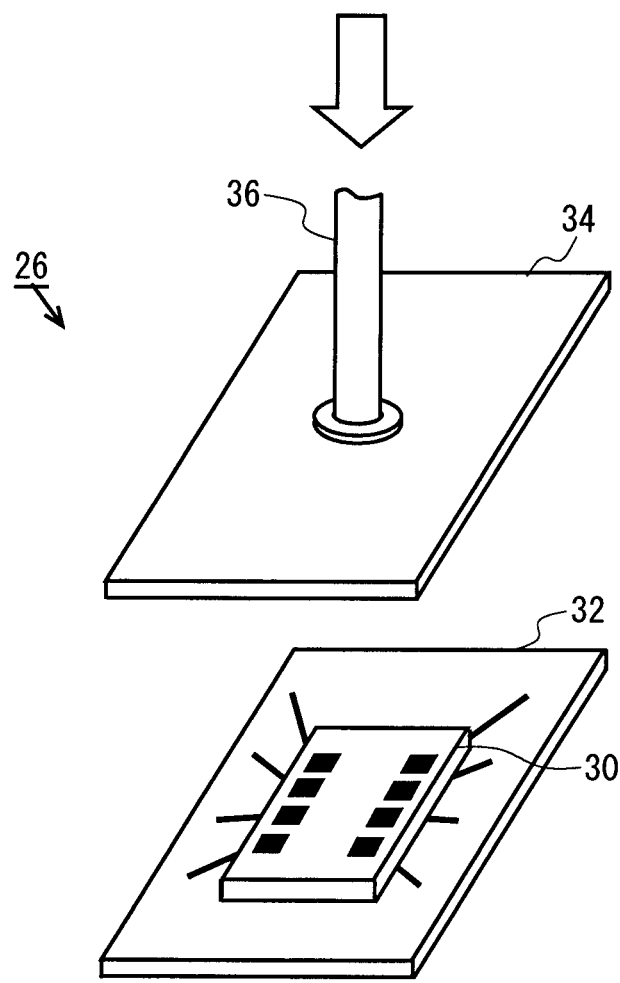
FIG. 10 shows an exemplary operation of the test packaging section 14 performed at step S33 of FIG. 5.
Figure 11:
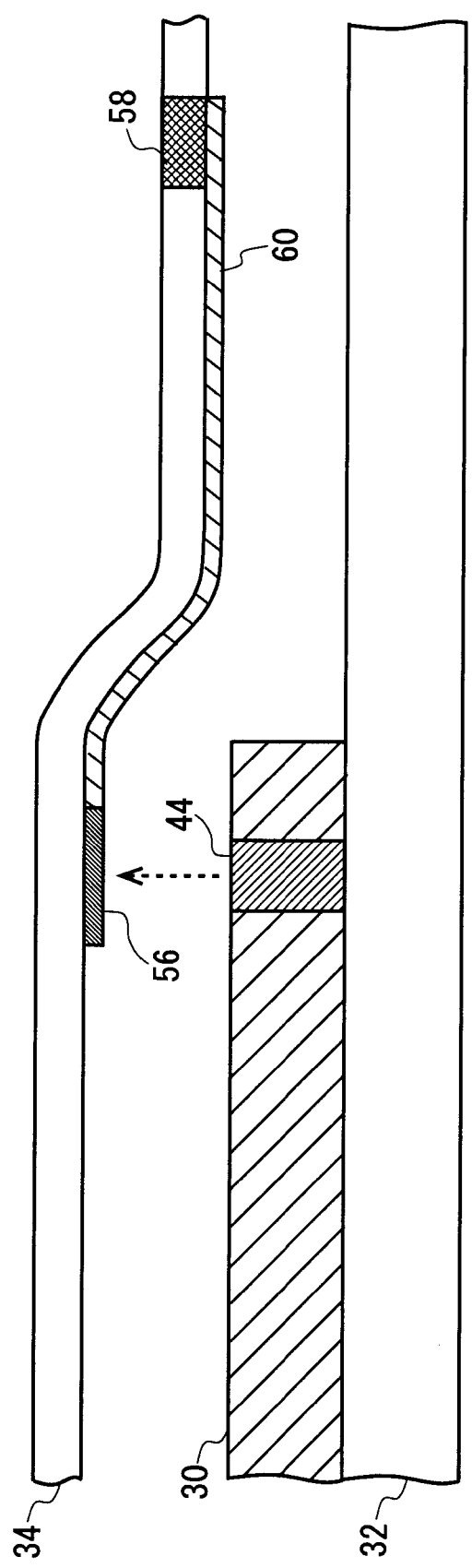
FIG. 11 shows an exemplary connection between the second device terminals 44 of the device 30 and the second substrate-side terminals 56 of the second substrate 34.
Figure 12:
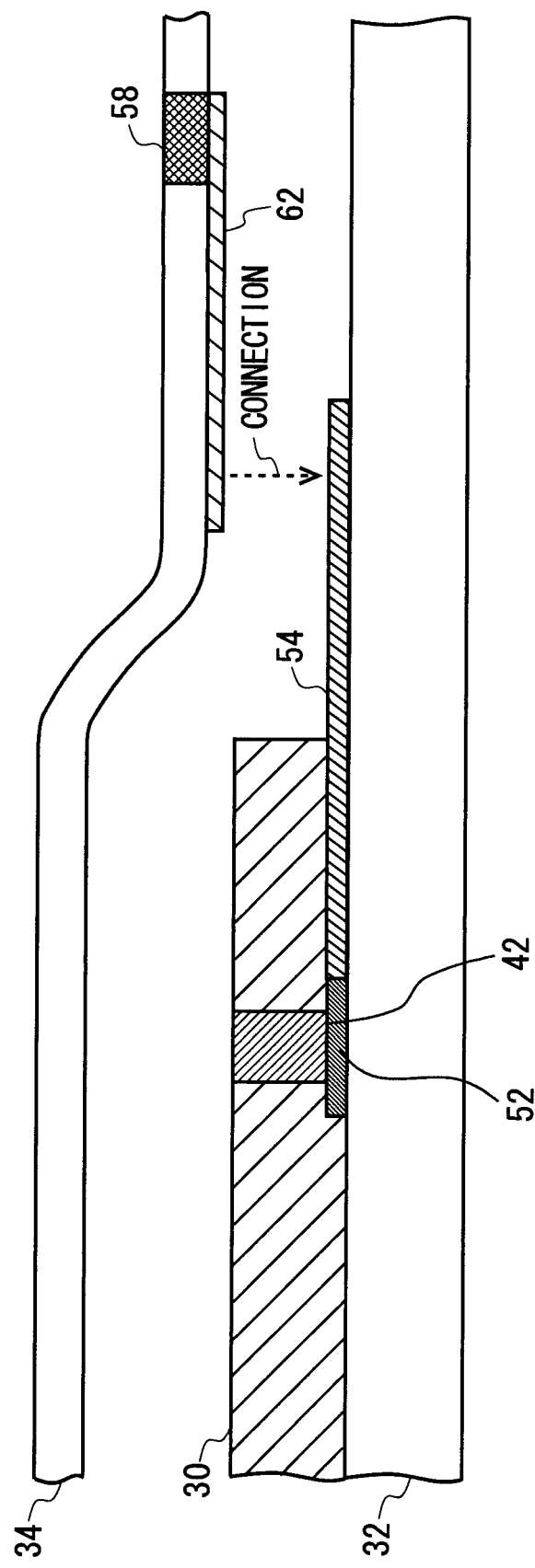
FIG. 12 shows an exemplary connection between the first wires 54 of the first substrate 32 and the third wires 62 of the second substrate 34.

FIG. 5 shows a process flow of the test packaging section 14 according to the present embodiment. FIG. 6 shows an exemplary operation performed from step S21 to step S24 of FIG. 5, and FIG. 7 shows an exemplary operation performed at step S25 of FIG. 5. FIG. 8 shows an exemplary connection between the device 30 and the first substrate 32. FIG. 9 shows an exemplary operation performed from step S26 to step S32 of FIG. 5, and FIG. 10 shows an exemplary operation performed at step S33 of FIG. 5. FIGS. 11 and 12 show an exemplary connection between the device 30, the first substrate 32, and the second substrate 34.

The flow shown in FIG. 5 represents the packaging of a device in chip form having device terminals on both surfaces, i.e. a first surface and a second surface, in a test package. First, at step S21, the detecting section 22 handles the device 30 using the handling apparatus 36, as shown in FIG. 6, for example. In this case, the handling apparatus 36 handles the device 30 by adhering the second surface of the device 30 thereto. As a result, the handling apparatus 36 can handle the device 30 while keeping the first surface exposed.

Next, at step S22, the detecting section 22 captures an image of the first surface of the device 30 using the image capturing apparatus 37, while the device 30 is handled by the device 30, as shown in FIG. 6, for example. The detecting section 22 then uses the data processing apparatus 38 to detect the positions of first device terminals 42 formed on the first surface of the device 30, based on the image captured by the image capturing apparatus 37.

Next, at step S23, the generating section 24 prints first substrate-side terminals 52 on the first substrate 32 to connect to the first device terminals 42, at positions corresponding to the first device terminals 42 of the device 30, as shown in FIG. 6, for example.

Next, at step S24, the generating section 24 uses the printing apparatus 40 to print patterns of first wires 54 on the first substrate 32, to provide conduction between prescribed positions and the first substrate-side terminals 52, as shown in FIG. 6, for example. The first wires 54 are used to connect the first device terminals 42 to the wiring pattern on the second substrate 34 connected to the external terminals 58.

Next, at step S25, the mounting section 26 mounts the device 30 on the first substrate 32, as shown in FIG. 7, for example. In this case, the mounting section 26 causes the first device terminals 42 of the device 30 to contact the first substrate-side terminals 52 of the first substrate 32, as shown in FIG. 8, for example. As a result, the mounting section 26 can create electrical conduction via the first substrate-side terminals 52 between the first wires 54 formed on the first substrate 32 and the first device terminals 42 of the device 30.

Furthermore, at step S25, the mounting section 26 mounts the device 30 on the first substrate 32 while maintaining the handling of step S21, i.e. without releasing the device 30 from the handling state of step S21. As a result, the relative position of the first surface of the device 30 with respect to the handling apparatus 36 does not change between when detection is performed and when mounting is performed, and therefore the mounting section 26 can cause the first device terminals 42 and the first substrate-side terminals 52 to accurately contact each other.

Yet further, at step S25, the mounting section 26 mounts the device 30 on the first substrate 32 such that the device 30 can be removed after the mounting. For example, the mounting section 26 may affix the device 30 to the first substrate 32 using an amount of force that does not result in damage to the device 30 when removing the device 30 from the first substrate 32.

Next, at step S26, the detecting section 22 uses the handling apparatus 36 to handle the device 30 while mounted on the first substrate 32, as shown in FIG. 9, for example. In this case, the handling apparatus 36 handles the device 30 by adhering to the surface of the first substrate 32 to which the device 30 is not affixed. In this way, the handling apparatus 36 can handle the device 30 with the second surface thereof exposed.

Next, at step S27, the detecting section 22 uses the image capturing apparatus 37 to capture an image of the second surface of the handled device 30, while the device 30 is mounted on the first substrate 32, as shown in FIG. 9, for example. The detecting section 22 then uses the data processing apparatus 38 to detect the positions of second device terminals 44 formed on the second surface of the device 30, based on the image captured by the image capturing apparatus 37. Next, at step S28, the detecting section 22 uses the data processing apparatus 38 to detect the positions of the first wires 54 printed on the first substrate 32, based on the image captured by the image capturing apparatus 37.

Next, at step S29, the generating section 24 uses the printing apparatus 40 to print the patterns of the second substrate-side terminals 56, which connect to the second device terminals 44, on the second substrate 34 at positions corresponding to the second device terminals 44 of the device 30, as shown in FIG. 9, for example. Next, at step S30, the generating section 24 uses the printing apparatus 40 to print the patterns of the external terminals 58 that connect the second substrate 34 to the external apparatus, as shown in FIG. 9, for example.

The external terminals 58 may be connected to through-wires that penetrate through the second substrate 34, for example. In this way, the external terminals 58 can connect the external apparatus to the second substrate 34 from a surface of the second substrate 34 on the opposite side of the surface on which the second substrate-side terminals 56 are printed.

The external terminals 58 may be formed on the second substrate 34 in advance. In this case, the process of step S30 is not performed. In the present embodiment, the external terminals 58 are formed on the second substrate 34 in advance. The external terminals 58 are terminals that penetrate from the top surface to the bottom surface of the second substrate 34, enabling connection at both the top and bottom surface.

Next, at step S31, the generating section 24 uses the printing apparatus 40 to print the patterns of second wires 60 between the external terminals 58 and the second substrate-side terminals 56, as shown in FIG. 9, for example. Next, at step S32, the generating section 24 uses the printing apparatus 40 to print, on the second substrate 34 patterns of third wires 62 between the external terminals 58 and positions corresponding to the first wires 54 of the first substrate 32 that connect to the first device terminals 42, as shown in FIG. 9, for example. For example, the printing apparatus 40 may print the patterns of the third wires 62 between the external terminals 58 that do not connect to second wires 60 and positions corresponding to the first wires 54.

The intervals at which the external terminals 58 are arranged may be greater than the intervals at which the first device terminals 42 and the second device terminals 44 are arranged on the device 30. As a result, the external apparatus can be easily connected to the second substrate 34.

Next, at step S33, the mounting section 26 suctions out the gas between the first substrate 32 and the second substrate 34, thereby sealing the device 30 between the first substrate 32 and the second substrate 34, as shown in FIG. 10, for example. More specifically, the mounting section 26 sandwiches the device 30 between the first substrate 32 and the second substrate 34 by placing the second substrate 34 on the surface of the first substrate 32 on which the device 30 is mounted, and connects the device 30 to the first substrate 32 and the second substrate 34. The mounting section 26 then seals the device 30 between the first substrate 32 and the second substrate 34.

For example, if the first substrate 32 is a flexible substrate, the mounting section 26 may seal the device 30 between the first substrate 32 and the second substrate 34 by suctioning out the gas between the first substrate 32 and the second substrate 34. As another example, the mounting section 26 may sandwich the device 30 between the first substrate 32 and the second substrate 34, and then use a tensile force to press the second substrate 34, which is a flexible substrate, against the first substrate 32.

Furthermore, at step S33, the mounting section 26 connects the second device terminals 44 of the device 30 and the second substrate-side terminals 56 of the second substrate 34 by bringing them into contact with each other, as shown in FIG. 11, for example. In this way, the mounting section 26 can create electrical conduction between the external terminals 58 formed on the second substrate 34 and the second device terminals 44 of the device 30, via the second substrate-side terminals 56 and the second wires 60.

Yet further, at step S33, the mounting section 26 connects the first wires 54 of the first substrate 32 to the third wires 62 of the second substrate 34 by bringing them into contact with each other, as shown in FIG. 12, for example. In this way, the mounting section 26 can create electrical conduction between the external terminals 58 formed on the second substrate 34 and the first device terminals 42 of the device 30, via the third wires 62, the first wires 54, and the first substrate-side terminals 52.

At step S33, the mounting section 26 also mounts the device 30 on the second substrate 34, while maintaining the handling of step S26, i.e. without releasing the device 30 from the handling state of step S26. As a result, the relative position of the second surface of the device 30 with respect to the handling apparatus 36 does not change between when detection is performed and when mounting is performed, and therefore the mounting section 26 can cause the second device terminals 44 and the second substrate-side terminals 56 to accurately contact each other, and can also cause the first wires 54 and the third wires 62 to accurately contact each other.

Furthermore, at step S33, the mounting section 26 mounts the device 30 on the second substrate 34 such that the device 30 can be removed after the mounting. For example, the mounting section 26 may affix the device 30 to the second substrate 34 using an amount of force that does not result in damage to the device 30 when removing the device 30 from the second substrate 34.

In the manner described above, the test packaging section 14 can manufacture a packaged device 28 for testing that includes the first substrate 32 on which the device 30 is mounted and the flexible second substrate 34 that, together with the first substrate 32, sandwiches the device 30 by being placed on the surface of the first substrate 32 on which the device 30 is mounted. In other words, the test packaging section 14 can function as a manufacturing apparatus that manufactures a device 30 packaged in a test package.

The test packaging section 14 can package a device 30 in a manner that enables the device 30 to be easily handled by a test apparatus, for example. Furthermore, the test packaging section 14 can allow the test apparatus to exchange signals with the device 30 via the first substrate 32 and the second substrate 34 forming the test package. Therefore, the test packaging section 14 can enable a test apparatus to test a device that has been cut from a wafer prior to the device being packaged in a commercial package.

Figure 13:
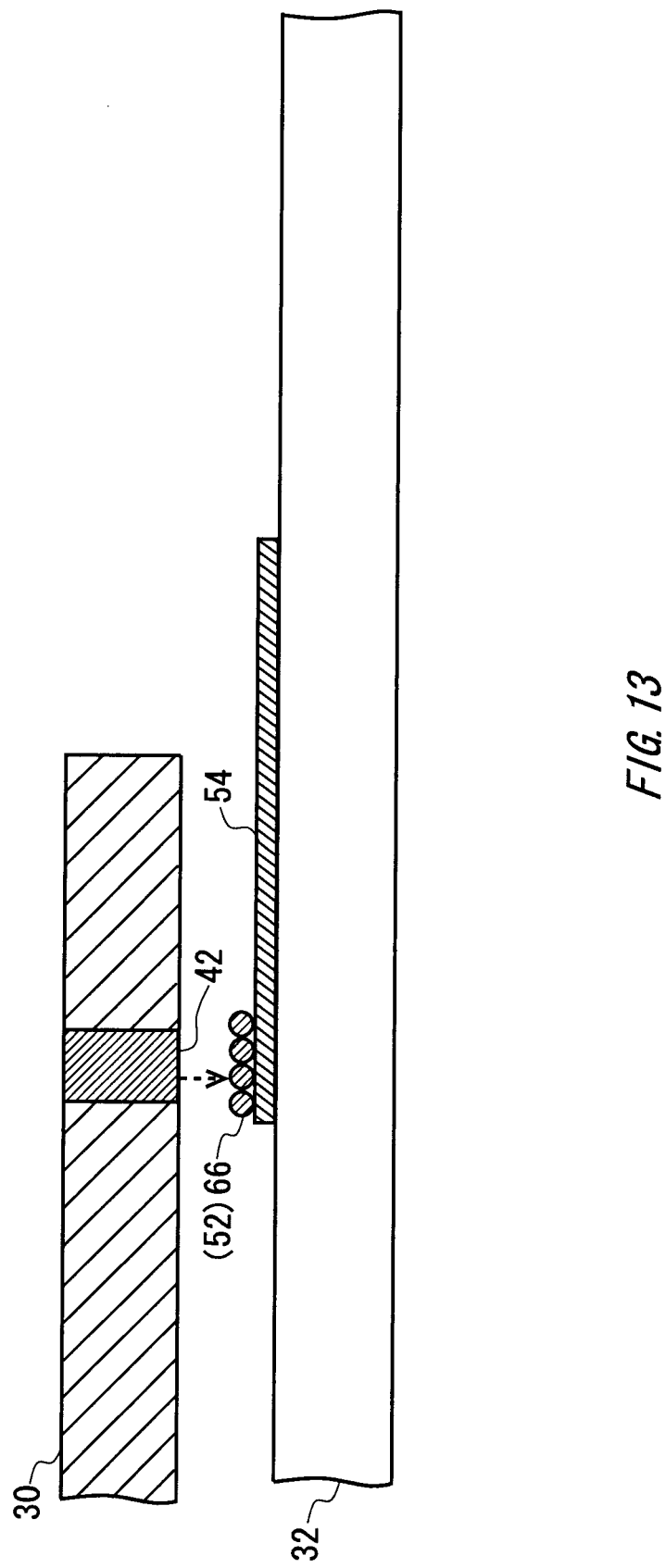
FIG. 13 shows an exemplary connection via terminal balls 66 formed between the device 30 and the first substrate 32.

FIG. 13 shows an exemplary connection via terminal balls 66 formed between the device 30 and the first substrate 32. When generating the first substrate-side terminals 52, the generating section 24 may arrange conductive terminal balls 66 that serve as the first substrate-side terminals 52 on the first substrate 32 at positions corresponding to the first device terminals 42.

The terminal balls 66 function as the first substrate-side terminals 52 when the device 30 is mounted on the first substrate 32 and the terminal balls 66 are sandwiched between the device 30 and the first substrate 32. The terminal balls 66 may be spherical spacers, such as shown in Japanese Patent No. 3140995. By forming the first substrate-side terminals 52 using the terminal balls 66, the generating section 24 can ensure reliable conduction between the device 30 and the first substrate 32.

Similarly, the mounting section 26 may arrange terminal balls 66 serving as the second substrate-side terminals 56 on the second substrate 34 at positions corresponding to the second device terminals 44. In this way, the generating section 24 can form the second substrate-side terminals 56 on the second substrate 34 by mounting the device 30 on the second substrate 34.

Figure 14:
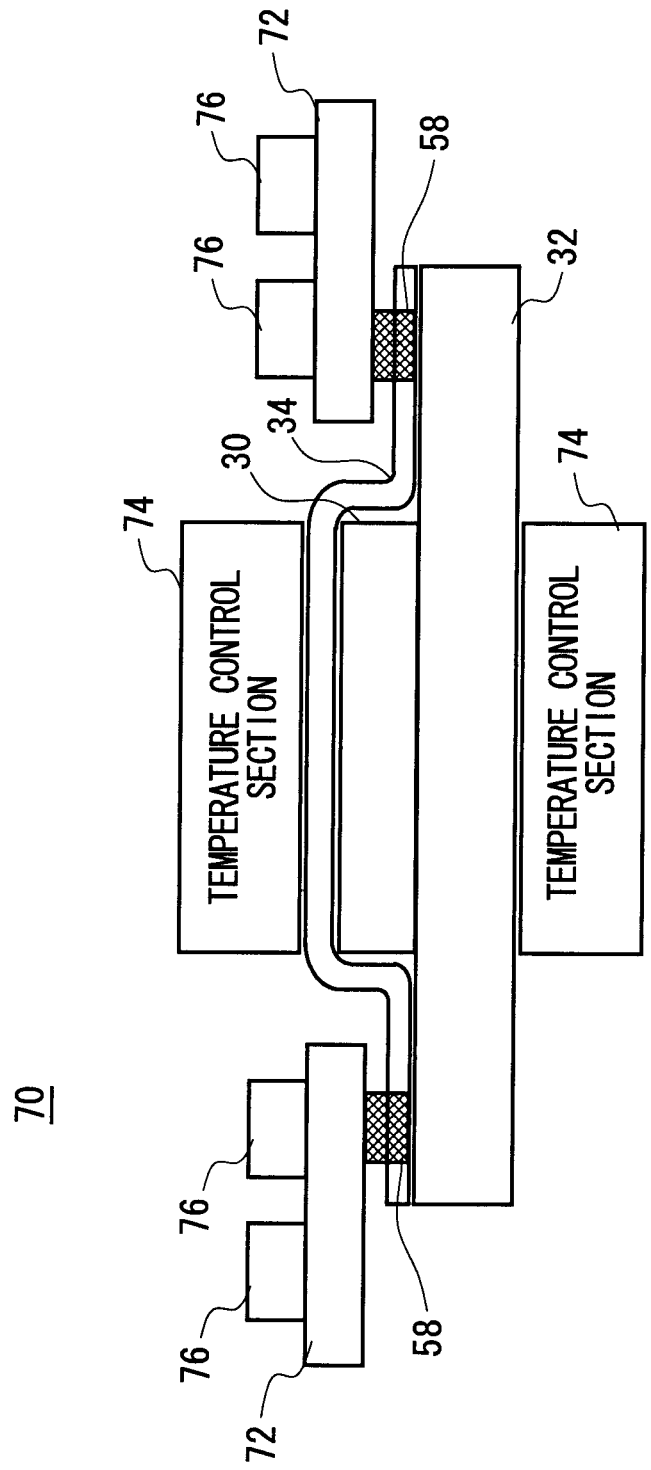
FIG. 14 shows an exemplary test cell 70.

FIG. 14 shows an exemplary test cell 70. After the device 30 has been packaged in a test package, the test packaging section 14 forms the test cell 70 by affixing the device 30 packaged in the test package to a test board 72. The test cell 70 may include the device 30 packaged in the test package, the test board 72, and at least one temperature control section 74.

The test board 72 is electrically connected to the external terminals 58 of the test package, which are the external terminals 58 of the second substrate 34 in the present embodiment. The test board 72 is a substrate for exchanging signals between an external test apparatus and the device 30. The test board 72 may include test circuits 76, such as a circuit that inputs and outputs signals to and from the device 30 and a circuit that inputs and outputs signals to the external test apparatus.

The temperature control section 74 is a heating or cooling component for controlling the device 30 within the test package to be a prescribed temperature. The test cell 70 may include two temperature control sections 74 that sandwich the device 30, for example. In this way, the temperature control sections 74 can maintain a designated temperature for the entire device 30. The test cell 70 can further simplify the connection between the test apparatus and the device 30.

Figure 15:
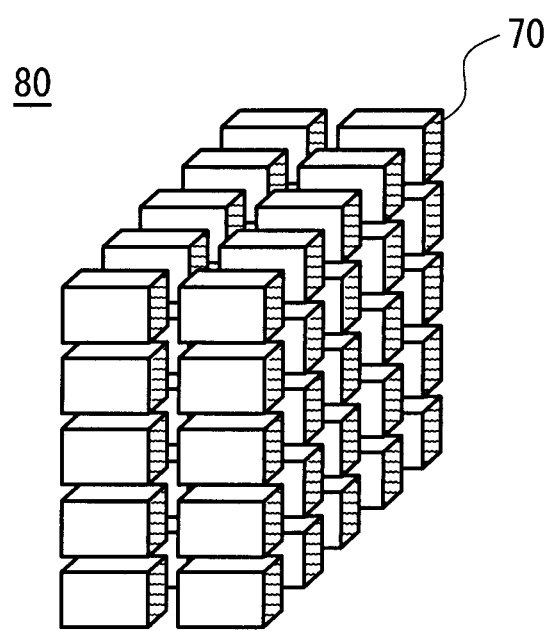
FIG. 15 shows an exemplary cell matrix 80.

FIG. 15 shows an exemplary cell matrix 80. The cell matrix 80 includes a plurality of test cells 70 arranged in a three-dimensional matrix. Transport, burn-in processing, and testing can be performed for each cell matrix 80 including a plurality of test cells 70, thereby making the devices 30 easy to handle and improving the throughput of the testing.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A manufacturing apparatus comprising:
    a detecting section that detects a position of a device terminal of a device;
    a generating section that generates a substrate-side terminal, which connects to the device terminal, on a substrate at a position corresponding to the detected position of the device terminal obtained from the detecting section; and
    a mounting section that mounts the device on the substrate and connects the device terminal to the substrate-side terminal.

2. The manufacturing apparatus according to claim 1, wherein
    the detecting section captures an image of the device and detects the position of the device terminal based on the captured image.

3. The manufacturing apparatus according to claim 1, wherein
the generating section prints a pattern of the substrate-side terminal on the substrate at a position corresponding to the device terminal.

4. The manufacturing apparatus according to claim 1, wherein
the generating section arranges conductive terminal balls that serve as the substrate-side terminal on the substrate at a position corresponding to the device terminal.

5. The manufacturing apparatus according to claim 1 wherein
the generating section prints a pattern of a wire between the substrate-side terminal and an external terminal for connecting an external apparatus to the substrate.

6. The manufacturing apparatus according to claim 5, wherein
the generating section also prints the external terminal.

7. The manufacturing apparatus according to claim 5, wherein
the generating section prints the pattern of the wire between the substrate-side terminal and the external terminal, which is formed in advance on the substrate.

8. The manufacturing apparatus according to claim 1, wherein
the generating section generates, on a first substrate at a position corresponding to a first device terminal of the device, a first substrate-side terminal that connects to the first device terminal and generates, on a second substrate at a position corresponding to a second device terminal of the device, a second substrate-side terminal that connects to the second device terminal, and
the mounting section sandwiches the device between the first substrate and the second substrate to connect the device to the first substrate and the second substrate.

9. The manufacturing apparatus according to claim 8, wherein
at least one of the first substrate and the second substrate is a flexible substrate, and
the mounting section suctions out gas from between the first substrate and the second substrate to seal the device between the first substrate and the second substrate.

10. The manufacturing apparatus according to claim 8, wherein
at least one of the first substrate and the second substrate is a flexible substrate, and
the mounting section sandwiches the device between the first substrate and the second substrate by using a tensile force to press the flexible substrate against the other substrate.

11. The manufacturing apparatus according to claim 8, wherein
the generating section generates, on the first substrate at a position corresponding to the first device terminal, the first substrate-side terminal that connects to the first device terminal,
the mounting section connects the first device terminal to the first substrate-side terminal by mounting the device on the first substrate,
the detecting section detects a position of the second device terminal while the device is mounted on the first substrate,
the generating section generates, on the second substrate at a position corresponding to the second device terminal, a second substrate-side terminal that connects to the second device terminal, and
the mounting section sandwiches the device between the first substrate and the second substrate by placing the second substrate on a surface of the first substrate on which the device is mounted, and connects the device to the first substrate and the second substrate.

12. The manufacturing apparatus according to claim 8, wherein
the mounting section packages the device in a test package by sealing the device between the first substrate and the second substrate, and
after testing the device packaged in the test package, the manufacturing apparatus removes the device from the test package by injecting gas between the first substrate and the second substrate.

13. The manufacturing apparatus according to claim 8, wherein
the generating section prints, on the first substrate, at least a portion of a pattern for connecting the first device terminal to a pattern on the second substrate connected to the external terminal, which connects an external apparatus to the second substrate, and
the mounting section causes the pattern on the first substrate connected to the first device terminal to contact the pattern on the second substrate connected to the external terminal, thereby connecting the first device terminal to the external terminal on the second substrate.

14. The manufacturing apparatus according to claim 1, wherein
the mounting section packages the device in a test package for testing by mounting the device on the substrate, and the manufacturing apparatus further comprises:
a removing section that removes the device whose testing is finished from the test package; and
a commercial packaging section that packages the device removed from the test package in a commercial package.

15. A method for manufacturing a packaged device, comprising:
detecting a position of a device terminal of the device;
generating, based on said detecting, a substrate-side terminal, which connects to the device terminal, on a packaging substrate at a position corresponding to the detected position of the device terminal; and
mounting the device on the substrate and connecting the device terminal to the substrate-side terminal, thereby creating conduction between an external terminal connected to an external apparatus and the device terminal, via the substrate-side terminal.

16. A manufacturing apparatus comprising:
a detecting section that detects a position of a device terminal of a device;
a generating section that generates a substrate-side terminal, which connects to the device terminal, on a substrate at a position corresponding to the device terminal; and
a mounting section that mounts the device on the substrate and connects the device terminal to the substrate-side terminal, wherein
the generating section generates, on a first substrate at a position corresponding to a first device terminal of the device, a first substrate-side terminal that connects to the first device terminal and generates, on a second substrate at a position corresponding to a second device terminal of the device, a second substrate-side terminal that connects to the second device terminal, and
the mounting section sandwiches the device between the first substrate and the second substrate to connect the device to the first substrate and the second substrate.

17. The manufacturing apparatus according to claim 16, wherein
- at least one of the first substrate and the second substrate is a flexible substrate, and
- the mounting section suctions out gas from between the first substrate and the second substrate to seal the device between the first substrate and the second substrate.

18. The manufacturing apparatus according to claim 16, wherein
- at least one of the first substrate and the second substrate is a flexible substrate, and
- the mounting section sandwiches the device between the first substrate and the second substrate by using a tensile force to press the flexible substrate against the other substrate.

19. The manufacturing apparatus according to claim 16, wherein
- the generating section generates, on the first substrate at a position corresponding to the first device terminal, the first substrate-side terminal that connects to the first device terminal,
- the mounting section connects the first device terminal to the first substrate-side terminal by mounting the device on the first substrate,
- the detecting section detects a position of the second device terminal while the device is mounted on the first substrate,
- the generating section generates, on the second substrate at a position corresponding to the second device terminal, a second substrate-side terminal that connects to the second device terminal, and
- the mounting section sandwiches the device between the first substrate and the second substrate by placing the second substrate on a surface of the first substrate on which the device is mounted, and connects the device to the first substrate and the second substrate.

20. The manufacturing apparatus according to claim 16, wherein
- the mounting section packages the device in a test package by sealing the device between the first substrate and the second substrate, and
- after testing the device packaged in the test package, the manufacturing apparatus removes the device from the test package by injecting gas between the first substrate and the second substrate.

* * * * *